(12) United States Patent
Berco

(10) Patent No.: US 8,975,617 B2
(45) Date of Patent: Mar. 10, 2015

(54) QUANTUM INTERFERENCE DEVICE

(71) Applicant: Dan Berco, Kiryat Ata (IL)

(72) Inventor: Dan Berco, Kiryat Ata (IL)

(73) Assignee: Dan Berco, Kiryat Ata (IL)

( * ) Notice: Subject to any disclaimer, the term of this patent is extended or adjusted under 35 U.S.C. 154(b) by 0 days.

(21) Appl. No.: 13/907,999

(22) Filed: Jun. 3, 2013

(65) Prior Publication Data

US 2014/0353588 A1    Dec. 4, 2014

(51) Int. Cl.
*H01L 29/66* (2006.01)
*G06N 99/00* (2010.01)

(52) U.S. Cl.
CPC ........ *H01L 29/66977* (2013.01); *G06N 99/002* (2013.01)
USPC .......................................................... 257/24

(58) Field of Classification Search
CPC ........... H01L 49/006; H01L 29/66977; G06N 99/002
USPC .......................................................... 257/24
See application file for complete search history.

(56) References Cited

U.S. PATENT DOCUMENTS

| | | | | |
|---|---|---|---|---|
| 5,497,015 A * | 3/1996 | Ishibashi et al. | ............... | 257/287 |
| 5,637,260 A * | 6/1997 | Okuda et al. | .................. | 252/506 |
| 5,640,022 A * | 6/1997 | Inai | ................................ | 257/26 |
| 5,917,195 A * | 6/1999 | Brown | ........................... | 257/22 |
| 7,236,667 B2 * | 6/2007 | Franson et al. | ................. | 385/37 |
| 2002/0066936 A1* | 6/2002 | Maris | ............................ | 257/431 |
| 2007/0104420 A1* | 5/2007 | Franson et al. | ................. | 385/31 |
| 2008/0083881 A1* | 4/2008 | Gorrell et al. | ................. | 250/399 |

* cited by examiner

*Primary Examiner* — Whitney T Moore

(57) ABSTRACT

A device to produce an output based on interference of electron waves is disclosed. Said device comprised out of two areas having different medium properties for propagation of an electron wave, where the first of said areas is connected to a source to inject electrons and the second of said areas is connected to a drain to collect electrons while said electrons have a propagation path through the device starting at the source and ending at the drain. Said areas are designed in a manner to result in advancing and reflected waves having interleaved sections along said path which yield interference, either constructive or destructive, thus determining the transport probability of the electron through the device. Said device is operated either as a switch, in a first embodiment, by adding a control gate, or as a detector, in a second embodiment, used for measurement of external particle ensemble properties.

19 Claims, 11 Drawing Sheets

QUANTUM INTERFERENCE DEVICE

BACKGROUND OF THE INVENTION (a) Field of the Invention

This invention relates to electron devices and in particular to quantum interference devices utilizing interference of electron waves within. Quantum interference devices usually utilize an external perturbation caused by a magnetic or electric field as well as optical interaction to modulate the electron wave interference.

(b) Description of the Related Art

A quantum interference device (QID) uses the interference of electron wave passing through at least two different channels. By using an external perturbation induced by a magnetic or electric field a different phase contribution is added in each channel thus resulting in a constructive or destructive interference of the electron wave as a function of the field intensity. Devices of this type are described in [1] Bandyopadhyay et al., IEEE IEDM86 1986, and in [2] EP0381591A2, [3] U.S. Pat. No. 5,371,388, [4] U.S. Pat. No. 5,157,467, [5] U.S. Pat. No. 5,521,735, all of which are incorporated herein by reference.

FIG. 1 is a quantum interference device in the prior art operated with a magnetic field. The intensity of the field is used to control the current passing through the QID. The initial electron wave propagates from a common channel 1 and into two separated channels 2 and 3 comprising a ring 4. The waves then converge back to a common channel 5 as the electron exits the device. A magnetic field marked B is induced inside the ring 4 as the electron pass through the device. An interference of the electron wave occurs once it converges back into 5. The magnetic field B affects the phase of sections 2 and 3, according to the Aharonov-Bohm effect, in a different manner due to inherent inhomogeneous structure of the material comprising ring 4, thus resulting in either a constructive or a destructive interference of the electron wave in section 5.

The Aharonov-Bohm (AB) effect is where the presence of a voltage potential V or magnetic field B affects the phase component of the electron wave function. The phase component of the electron wave is known to depend on the potential through the following relation:

$$\Delta\theta = 2\pi e/ch \cdot V \cdot t$$

Where e is the electron charge, h is Plank's constant, c the speed of light, $\Delta\theta$ is the phase gained for spending a time period t with potential V, or in the presence of magnetic flux $\Phi$ by:

$$\Delta\Phi = 2\pi e/ch \cdot \Phi$$

Referring to FIG. 2, the transport probability through the QID of FIG. 1 is shown as a function of the magnetic field B and area cross section A. When the phase difference between the two mentioned paths is an odd multiple of $\pi$, a destructive interference will occur and the transport probability will drop. On the other hand, when the phase difference is an even multiple of $\pi$ a constructive interference will result in high transport probability and high current thus resulting in the depicted oscillations. The transmission factor $|T|^2$ is given by:

$$|T|^2 = \cos^2\{e/(h/2\pi) \cdot A/2 \cdot B\}$$

FIG. 3 is a quantum interference device in the prior art [1] operated using an electric field. Two GaAs quantum layers 10 and 11 are layered with an AlGaAs barrier layer 12 between them, to form two conducting channels. Electrons traveling through the device from the source 6 to the drain 9 pass either through channel 10 or 11. Since the thickness of the barrier layer 12 is small at both ends, tunneling occurs between the layers 10 and 11 at both ends of said barrier. However, the thickness of the barrier 12 is large at the central portion, thus little tunneling happens there. A voltage can be applied to the central portion by using a gate terminal 7, and a potential difference $\Delta V$ can be induced between the two channels 10 and 11. As a result, the electron wave with vectors $k_1$ and $k_2$ traveling in the two channels have the following difference according to the electric AB effect:

$$K_1 - k_2 = e \cdot \Delta V/(h/2\pi v$$

Similarly the transmission factor is given by:

$$|T|^2 = \cos^2\{e \cdot \Delta V \cdot \tau_t/2(h/2\pi)\}$$

Where $\tau_t = L/v$ is a time required for electrons to pass through channels 10 and 11 (as marked in FIG. 3) where v is the velocity of the electrons. In this manner, the current through the QID is controlled by the electric field induced by the gate terminal 7 producing a potential difference $\Delta V$.

FIG. 4 shows the current through the device of FIG. 3 as a function of the gate voltage. The current has an oscillatory behavior as a function of the gate voltage due to constructive and destructive interference of the electron waves resulting from the phase difference mentioned above. Lower drain voltages result in lower electron velocity v thus affecting the oscillation period as shown.

FIG. 5 is a quantum interference device in the prior art [2] operated using an electric field. Electrons are injected from the source 21 and collected by the drain 31 as they travel through a confined passage. The passage is confined by a mean 28, implemented by a doping implant, to create a depletion region where electrons cannot enter, and by control terminals 25 and 32 inducing a depletion region using the field effect, thus resulting in two confined conduction channels 26 and 27 through which electrons can propagate. The terminals 22 and 33 are used to induce a different potential in the conduction channels 26 and 27 respectively. The voltage potential difference between the two channels results in a different phase acquired by the electron wave as it passes through each channel according to the AB effect. This phase difference is in direct proportion to the potential difference between terminals 22 and 23. The size of the confined region is kept lower than the inelastic scattering length of the electron in the material. As a result, an interference of the electron wave as a function of the said potential difference will occur, thus modulating the transmission through the channels and the source to drain current. The phase difference $\Delta\phi$ between the two electron waves respectively passing through the channel regions 26 and 27 is represented by:

$$\Delta\phi = (k_{F2} - k_{F1})L = [(2m(E_F - E_{0\,2}))^{1/2} - (2m(E_F - E_{0\,1}))^{1/2}]L/h$$

Where L stands for the effective length of the channel regions 26 and 27 and the value of $E_{0\,1}$ and $E_{0\,2}$ represent the confined electron energy level modified by the terminals 25 and 32.

FIG. 6 is a cross section of the quantum interference device in the prior art [2]. The cross section is depicted along the line AA' as shown in FIG. 5. The channel confinement implanted means is marked 40 with a resulting depleted region 41. The terminals 25a and 32a use the field effect to induce depletion regions 37 and 38 respectively. The layers marked as 34, 35 and 36 are constructed to yield a quantum well confining the electrons in the directions perpendicular to their wave vector by using AlGaAs and GaAs respectively. As a result the electron energies ($E_{0\,2}$ and $E_{0\,1}$) are quantized inside the well and having their energy above the Fermi level $E_F$.

FIG. 7 depicts a quantum interference device in the prior art [3] operated using an electric field. The layers marked in the structure as 46, 47 and 48 are used to create a quantum well to confine electrons thus forming discrete energy level occupation states in the transverse direction. Control gate 43 is used to induce a depletion region 44 under the gate. The gate bias voltage V results in a depletion width d thorough the field effect according to:

$$d=(2\epsilon_s V/eN)^{1/2}$$

Where e is the electron charge, N the doping concentration in the channel and V the gate potential. A modulation of the gate voltage ΔV will result is changes to the depletion layer size Δd:

$$\Delta d = d(\Delta V/2V)$$

The electrons are confined laterally by the depletion layer 44 and high resistivity areas 42 and 49 thus forming narrow conduction channels having a width depending on the gate bias. An applied external magnetic field B will induce a phase in each channel according to the AB effect which depends on the effective area as well. The gate voltage change results in a change of the effective channel area AA. In this manner the transmission is modulated according to:

$$|T|^2 = \cos^2\{e/(h/2\pi) \cdot A/2 \cdot B(1+\Delta A/A)\}$$

Thus the control gate is used to modulate the device source to drain current by controlling the cannel width.

FIG. 8 is a schematic band diagram of the device of FIG. 7. The electron population occupies the energy states above the conduction band edge and below the Fermi level. The electron allowable occupation states are divided to two separate regions by the said depletion layer thus forming two conduction channels marked 47a and 47b.

FIG. 9 is a quantum interference device operated as a photo detector in the prior art [3]. Electrons travel from the source region 50 to the drain region 54 through a conduction region 52 which is laterally confined by a high resistivity area 51 and a depletion region induced by a control gate 53, thus forming two spatially separated conduction channels. The control gate is used to modulate the device current, as mentioned above, by controlling the conduction channel width.

FIG. 10 is a schematic band diagram of the device of FIG. 9. a Photon, having an energy hv, greater energy than the band gap energy ($E_c$-$E_v$), is absorbed to excite an electron hole pair. The holes are attracted to the gate region as the valance band level there is higher in energy and modify the potential under the gate. As a result, the depletion layer shrinks as indicated by dotted lines and the effective area A is reduced, thus affecting the drain current and resulting in a photo current $\Delta i_G$. Since the drain current is changed by the photon absorption a photo detector operation is attained.

FIG. 11 is a schematic diagram of a light interferometer having either a monochromatic or a white light source. An interferometer is a commonly used apparatus to produce interference patterns of light. A source 57 emits either monochromatic or white light having a propagation direction as indicated by the wave vector 59. This incident wave encounters a beam splitter 64 which transmits about half of the energy laterally as indicated by 60 and reflects about half of the energy vertically in the direction indicated by 63. The waves 60 and 63 encounter reflective mirrors marked 65 and 58 respectively. The resulting reflected waves propagate in the directions marked 61 and 62 back to the beam splitter where, after being reflected once again, they advance as 66 and 67 to a display screen 68. Since the source 57 emits energy in a continuous manner, the result is a standing wave within the apparatus which is a sum of all the propagating and reflected waves. The mirror 58 is of a fixed nature while 65 may be moved along the lateral axis as indicated by the deflection d. The said standing wave may have either a constructive or destructive interference depending on whether the path difference 2d is either an even or an odd multiple of the emitted light half wavelength.

Furthermore, the apparatus size L must be kept smaller than the coherence length of the emitted light. The coherence length is a measure of how far the phase information of the emitted wave is kept consistent as it propagates through the apparatus and is given by:

$$U=c/\nu$$

Where c is the speed of light and ν is the light frequency.

When the mirror 65 is displaced by distance d, the effective size of the apparatus changes and a constructive or destructive interference occurs as a function of d. If the source is of a monochromatic nature, the resulting pattern can be seen on the screen 68 as a cyclic pattern of light intensity depending on d. However, if the source emits white light, the resulting pattern resembles the one seen on screen 69. The reason is that in the case of white light only a perfectly symmetrical apparatus would result in a zero phase difference between the lateral and vertical path sections which allows most of the energy to be transmitted through, regardless of the light wave initial phase. Once the mirror 65 is displaced in any direction away from its optimal location, a sharp drop in the transmission of energy through the apparatus occurs.

The basic concept of particle wave duality introduced by quantum mechanics is still in agreement with the classical theory of the interferometer mentioned above. Even when the light source is replaced by a single photon source, emitting a single photon at a given time interval, the intensity pattern as seen on the screen is still consistent with the classical picture. The underlying theoretical explanation views the photon as if having an interference with itself as it passes through the apparatus thus having a transmission probability. If the lateral and vertical path sections are unbalanced, resulting in a half wavelength difference, the classical condition for a destructive interference, the transmission probability of the photon would drop significantly. If, on the other hand, the apparatus is perfectly balanced, the transmission probability would be close to unity, regardless of photon coherence or initial phase, a situation similar to the classical white light source case.

It has been demonstrated by several experiments, given herein as a reference, that interference patterns of the well known double slit experiment could be achieved with fermions, being electrons or ions, and even complex molecules such as C60. These experiments utilize a source where a single particle is emitted at a given time interval, which still result in the known interference patterns, thus further enforcing the quantum mechanical view of the wave particle duality known as the "Copenhagen Interpretation". The coherence length in this case depends on the particle De Broglie wavelength having a tighter restriction on the apparatus physical dimension.

FIG. 12 is showing the theoretical carrier population density as a function of energy for fermions in a lattice. The conduction and valance bands are marked as $E_c$ and $E_v$ respectively, while the Fermi level is marked as $E_f$. The density of states function describes the availability of states in the reciprocal space and has a square root dependence on the energy in three dimensions space. The Fermi Dirac function (FD), which has an inverse exponential dependence on the energy, is marked $f$ and gives the occupation factor for electrons in the conduction band as a function of temperature and energy.

The occupation factor for holes in the valance band is according to $1-f$. The carrier population is a result of a multiplication of the FD function and the density of states for both electrons and holes and can be seen in FIG. 12 as well. The average electron kinetic energy is equal to $\frac{1}{2}kT$ for every motion degree of freedom and is derived using the following expression:

$$E_{avg} = \int E \cdot n_{(E)} \cdot dE / \int n_{(E)} \cdot dE$$

The QID of the prior art presented here have a complex structure, a fact that makes them unsuitable for use in high volume integrated circuits. The active area where the AB interaction takes place must be kept small while the supporting structure is very large in comparison. This overhead is extremely costly and area consuming and cannot be tolerated in state of the art integrated circuits. The further complexity of the layered structure presented in some of the prior art devices requires a special process which is even more costly and does not integrate easily with the widely used silicon process. Furthermore, some prior art QID are operated using an external field to produce the resulting current modulation, which adds further difficulty and makes it impossible to use them along side conventional switching devices, such as MOSFET, where such a field would compromise their functionality. In addition, prior art QID are designed to operate using either an electric or a magnetic field or a photonic interaction. None of the prior art QID have a disclosed structure able to produce the same functionality regardless of the interaction type.

The background and associate prior art erase procedures are described in the following publications: [I] Journal of Vacuum science and Technology, vol. 6 January/February 1998, pp. 131-133, Mankeiewich et al., "observation of Aharonov-Bohm effect in quasi-one-dimensional GaAs/AlGaAs rings" [2] Applied Physics Letters, vol. 48, February 1986, pp. 487-489, S. Datta et al., "Proposed Structure for Large Quantum Interference Effect" [III] Applied Physics Letters, vol. 57 no. 21, November 1990, pp. 2231-2233, M. Okuda et al., "Novel Electron Interferometers using field induced decoupling in double quantum well structures" [IV] Feynman R., "The Feynman Lectures on Physics", vol. III, ISBN 0-201-02118-8P [V] Markus A. et al., "Wave Particle Duality of C60 Molecules", Nature, 14 Oct. 1999 [VI] Donati O. et al., "Experiment on Electron Interference", American Journal of Physics, vol. 41, pp. 639-644.

BRIEF SUMMARY OF THE INVENTION

The main objective of the present invention is to introduce a novel quantum interference device that addresses the drawbacks associated with the prior art. Specifically a device which is both scalable in size and cost effective by simplicity of structure and manufacturing process. The device described in the present invention has a structure which is highly suitable for high scale integrated circuits. Furthermore, the disclosed structure has inherently higher immunity for direct source to drain tunneling, due to the relative physical location of the drain terminal in relation to the source terminal, which allows for even better scalability into the nanometer regime.

Another objective of the present invention is to introduce a QID which is suitable for construction of large arrays. The proposed structure herein may be implemented either in a planner manner, as a surface device over an insulator substrate, or vertically, having a fin device like structure, for even greater array densities. Construction of large device arrays, such as for performing high end logic computations or memories, requires a device which is both small in size and does not interfere with the operation of adjacent devices. The device of the present invention is constructed in a manner which allows complete physical isolation between neighboring devices when aggregated to form an array thus reducing the mutual interaction.

The present invention discloses a QID which may be used to function in a first embodiment as a switch, or in a second embodiment as a detector, by using the same structure. This in turn allows combining switching devices along with sensory devices using the same process on the same integrated circuit in a simple and cost effective manner.

Another aspect of innovation introduced by the second embodiment of the present invention is the ability to respond to an external interaction with electric or magnetic fields, as well as with a photon, using the same structure. Contrary to prior art quantum interference devices where the interaction, yielding in a measurable effect through the device operation, is restricted and specific to one type of interaction.

Referring to FIG. 13, the present invention discloses a quantum interference device, comprising out of at least two areas (marked 100 and 101) having different medium properties for propagation of an electron wave (different dielectric properties), where the first of said areas 100 is connected to a source terminal 110 to inject electrons and the second of said areas 101 is connected to a drain terminal 112 to collect electrons while said electrons have a propagation path through the device starting at the source terminal and ending at the drain terminal. Furthermore, said areas are designed in a manner to result in advancing and reflected electron waves having one or more interleaved sections along said path which yields an internal interference of the electron wave with itself, being either constructive or destructive at the drain thus determining the transport probability of the electron through the device.

An initial electron wave 111 has a wave vector and propagation direction parallel to the BB' symmetry axis, as it encounters the interface (marked as 119) between the two areas, constructed to have an angle of 45°, it is split into an advancing wave 117, which travels along the BB' axis, and a reflected wave 114, which travels along AA'. Both waves are reflected from the device surface boundary as 118 and 113 respectively and travel along the same axes back to said interface. Additional reflections from the interface and device boundary result in both waves traveling to the drain terminal along the AA' axis and marked as 115 and 116. If the length L is be kept under the coherence length, which depends on the electron De Broglie wave length λ, and is an integer multiple of this wavelength, a constructive interference will occur resulting in a standing wave and a high propagation probability through the device.

Using the indicated Cartesian coordinate axes, FIG. 13 depicts a cross section of the disclosed device along the XY plane while the Z-axis is perpendicular to the figure plane. In the case that the external boundaries of the device are parallel to the X and Y axes, and that wave vector 111 advances along the X direction (on segment BB'), and wave vectors 115 and 116 advance along the negative Y direction (on segment AA'), the angle between the interface 119 and the external boundary is marked as 152. The angle of incidence, at which the electron wave vector 111 strikes the interface 119, is determined in relation to the normal vector to the interface according to elementary optics. The normal vector is defined by mathematical conventions to be perpendicular to the interface and could be either directed into the first area (marked as 150) or into the second area (marked as 160). The angle marked as 151 is the angle of incidence at which wave 111 hits the interface 119. The angle marked as 161 is the angle of incidence at which waves 115 and 116 are reflected from the interface 119. The QID is designed so that each of these angles equals 45 degrees. By applying basic geometry it is easily seen that angle 152 equals 45 degrees as well. Furthermore, it is obvious to those skilled in the art that the disclosed functionality is mainly achieved by placing the source 110, drain 112 and gate 120 aligned with the path segments BB' and AA' respectively, and by designing the said angle of incidence to equal 45 degrees regardless of the external shape of the device, while keeping the traveling and reflected wave components on the said path segments.

The device is symmetrical, having an equal length for each path segment along the axes AA' and BB', thus the phase difference between the paths of the traveling and reflected waves equals zero. The electrons injected from the source have an energy occupation according to the Fermi-Dirac distribution multiplied by the density of states function for the material comprising area 100 as seen in FIG. 12. Furthermore, all electrons injected at the source for each energy level of said distribution have a random initial phase. The electron could be described as a free wave in the direction of propagation along AA' and BB' thus the said energy distribution is continuous above the conduction band edge of 100 and 101. This situation is similar to the balanced white light interferometer case, where high transmission of energy is achieved through the device, resulting in large source to drain current.

A constructive interference of the said standing wave will occurs when L is an integer multiplication of the electron wavelength $\lambda$. Since the energy distribution above the conduction band edge is of continuous nature, there would be an energy level at which electrons having the said initial kinetic energy would have a high transport probability thorough the device regardless of their initial phase. Since the electron energy distribution above the conduction band edge is of continuous nature, there would be an energy level at which electrons having the said initial kinetic energy would have a high transport probability thorough the device regardless of their initial phase. The length L is designed in a manner to result in a constructive interference corresponding to either the average or the peak electron energy of the said distribution. Any change in the said path would result in a strong reduction of the transport probability and source to drain current, thus creating a measurable effect.

In a first embodiment of the present invention, as can be seen in FIG. 13, a control gate terminal 120a is added over an insulating layer 121a, to induce a field effect in the said device comprising area 100a, which results in a depletion region 122a of width d. The electron wave cannot propagate into said depletion region, since the density of states function of the material comprising area 100 is shifted to exclude the incident electron energy level from the allowable states in the region. The said depletion region, having a width proportional to the gate bias level, is formed in vicinity to the gate terminal and modifies the length of the path section originally intersecting that region, thus modifying the acquired phase contributed by this path section by $2\pi \cdot d/\lambda$ for both the advancing wave 114a and reflected wave 113a resulting in either a constructive or a destructive interference of the said waves and a change in the transport probability through the device.

By optimizing the said gate bias the transport probability could be maximized to compensate for any non symmetrical device structure mismatches. Any deviation from the said optimized bias would result in a corresponding change $\Delta d$ in the said depletion width and a phase change to both waves 113a and 114a having a magnitude of $2\pi \cdot \Delta d/\lambda$. A destructive interference would occur when $2\Delta d = \frac{1}{2}\lambda$. In this manner a high speed switching functionality may be obtained, since even a small change in the said path length results in a large change in the acquired phase which in turn changes the transport probability.

In a second embodiment of the present invention, as depicted in FIG. 14, the said device is used to measure the characteristics of an external ensemble, consisting of at least one particle, by having an interaction between the electron and said ensemble where said interaction affects one or more components of the electron wave function in the path section in vicinity to the ensemble thus generating a measurable effect.

The ensemble could be a photon (FIG. 15) or form either an electric (FIG. 16) or a magnetic (FIG. 17) dipole, while said interaction could be based on the Aharonov-Bohm (AB) effect, carried through the electromagnetic force or by absorption of said photon.

When the said interaction is carried through the AB effect, being either the electrostatic AB or magnetic AB, the electron wave phase component is modified as a result and the transport probability through the device is changed. When the interaction is carried through the electromagnetic force or photon absorption the propagation path is modified to deviate from the symmetry axes AA' and BB' thus shifting the electron transport probability from the said optimal state. The structure implementation of the QID in the present invention has no restriction over the nature of the interaction, thus an interaction with a magnetic or electric dipole produces the said measurable effect which is apparent in the source to drain current.

The said interaction can occur directly between the said ensemble and the electron, (based on a direct electromagnetic force or a direct exchange of a photon as mentioned above) or indirectly, by adding a metal layer to at least one surface of the said device, as shown in FIG. 18, where the said interaction, is achieved through the image charge effect. In the case of the ensemble comprising of an electric net charge or a dipole moment, or through a surface Plasmon wave invoked by a photon as seen in FIG. 19, force acting on the electron will alter its said path which would deviate from the said optimal state. The end result would be the same as the above mentioned, where the transport probability decreases abruptly and a sensor functionality is achieved.

An additional degree of freedom to control and optimize the said transport probability could be achieved by using an external field marked 140, being either electric or magnetic, may be used to interact with the electrons along segments of the propagation path, thus affecting the phase acquired along the path and formation of a constructive or destructive interference. This interaction could be carried through the AB effect or the electromagnetic force to help tune the said path to its optimal state.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

The present invention discloses a QID which may be used to function in a first embodiment as a switch, or in a second embodiment as a detector, by using the same basic structure. This in turn allows combining switching devices along with sensory devices using the same process on the same integrated circuit in a simple and cost effective manner.

Another aspect of innovation introduced by the second embodiment of the present invention is the ability to respond to an external interaction with either electric or magnetic fields, as well as with a photon. Contrary to prior art quantum interference devices where the interaction, yielding in a measurable effect during the device operation, is restricted and specific to one type.

Figure 13:
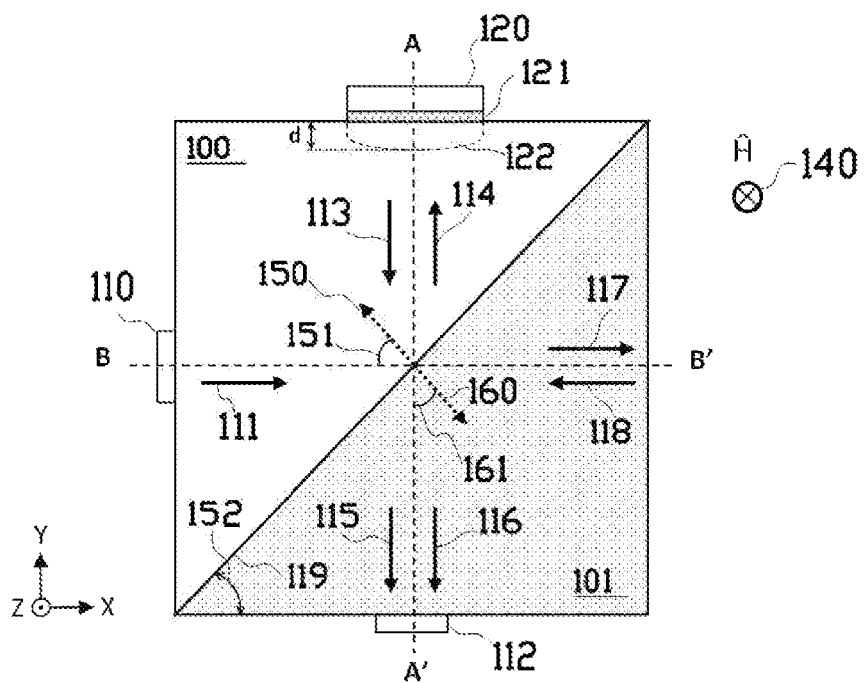
FIG. 13 is a quantum interference device in a first embodiment of the present invention.

Referring to FIG. 13, the present invention discloses a quantum interference device (QID), comprising out of at least two areas (marked 100 and 101) having different medium properties for propagation of an electron wave (different dielectric properties), where the first of said areas 100 is connected to a source terminal 110 to inject electrons and the second of said areas 101 is connected to a drain terminal 112 to collect electrons while said electrons have a propagation path through the device starting at the source terminal and ending at the drain terminal. Furthermore, said areas are designed in a manner to result in advancing and reflected electron waves having one or more interleaved sections along said path which yields an internal interference of the electron wave with itself, being either constructive or destructive at the drain thus determining the transport probability of the electron through the device.

By using two materials having a small difference in the conduction band energy level (for example a heterogeneous junction) a step like potential barrier in the conduction band is formed at the interface 119. According to quantum mechanical theory, a free particle described by a wave function passing over a step like potential barrier results in a reflected and transmitted waves. When the potential step size is in the order of the electron kinetic energy at room temperature there are many occupied energy states available in both 100 and 101 for an electron to travel from the source 110 to drain 112 through the device.

An initial electron wave 111 has a wave vector and propagation direction parallel to the BB' symmetry axis, as it encounters the interface (marked as 119) between the two areas, constructed to have an angle of 45°, it is split into an advancing wave 117, which travels along the BB' axis, and a reflected wave 114, which travels along AA'. Both waves are reflected from the device surface boundary as 118 and 113 respectively and travel along the same axes back to said interface. Additional reflections from the interface and device boundary result in both waves traveling to the drain terminal along the AA' axis and marked as 115 and 116. If the length L is kept under the coherence length, which depends on the electron De Broglie wave length $\lambda$, and is an integer multiple of this wavelength, a constructive interference will occur resulting in a standing wave and a high propagation probability through the device.

Figure 1:
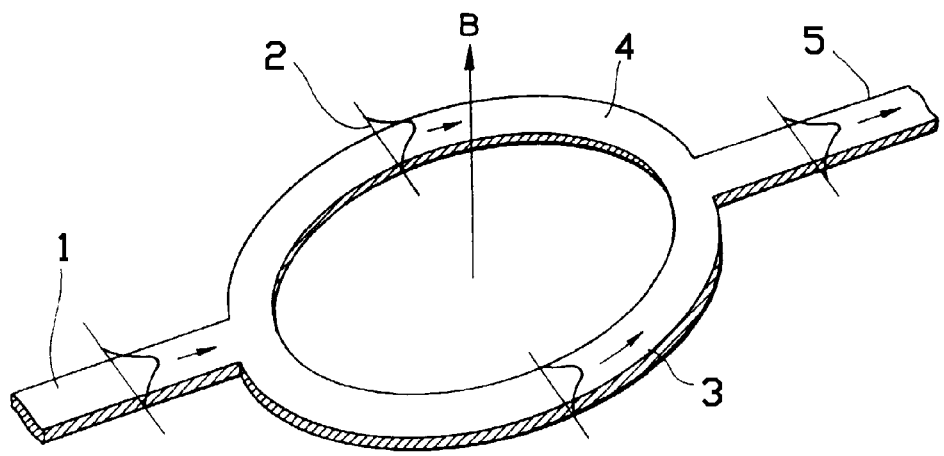
FIG. 1 is a quantum interference device in the prior art operated with a magnetic field.
Figure 2:
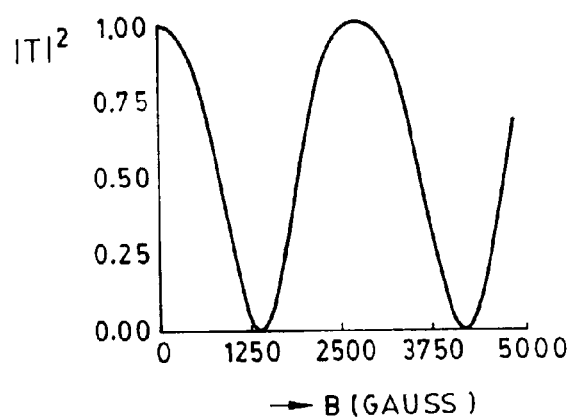
FIG. 2 shows the transmission through the device of FIG. 1 as a function of the magnetic field.
Figure 3:
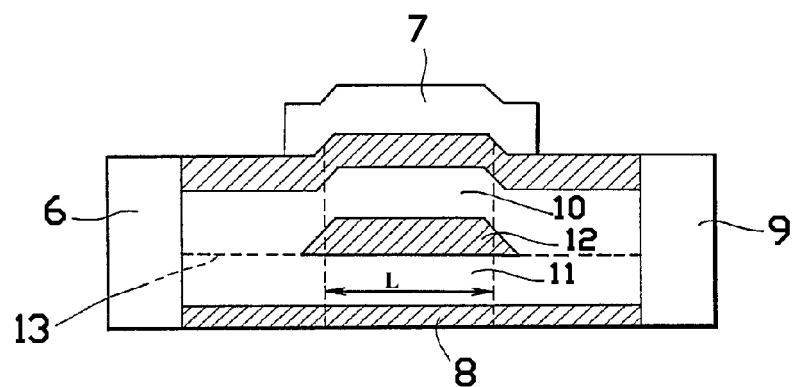
FIG. 3 is a quantum interference device in the prior art [1] operated using an electric field.
Figure 4:
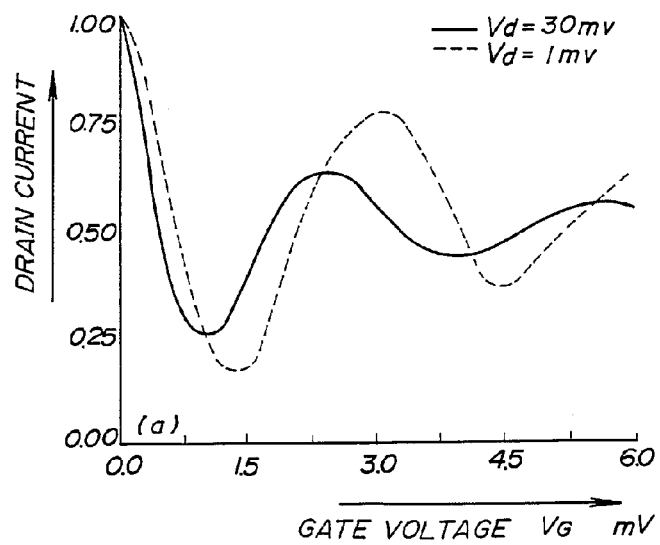
FIG. 4 shows the current through the device of FIG. 3 as a function of the gate voltage.
Figure 5:
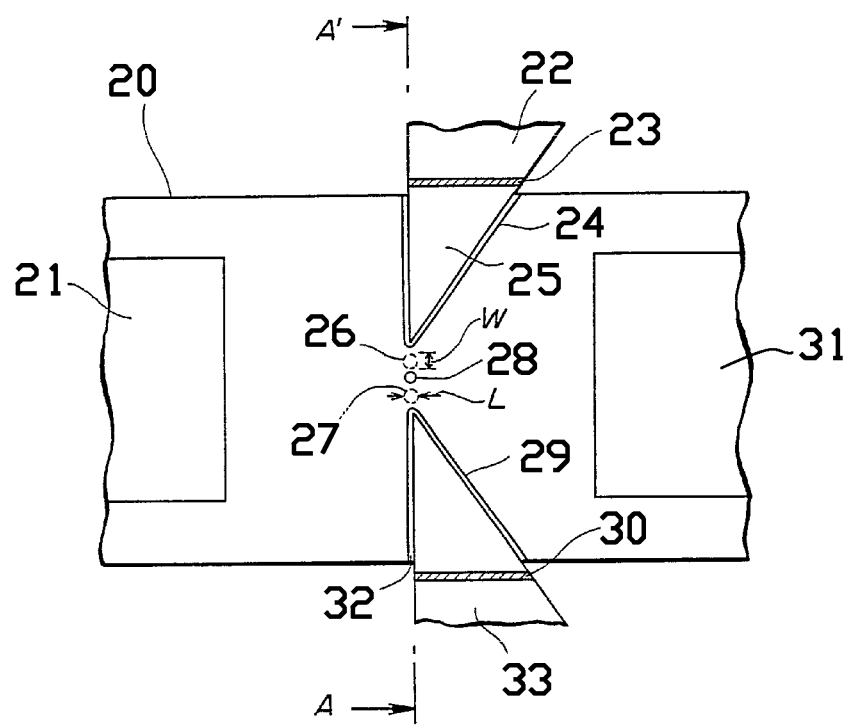
FIG. 5 is a quantum interference device in the prior art [2] operated using an electric field.
Figure 6:
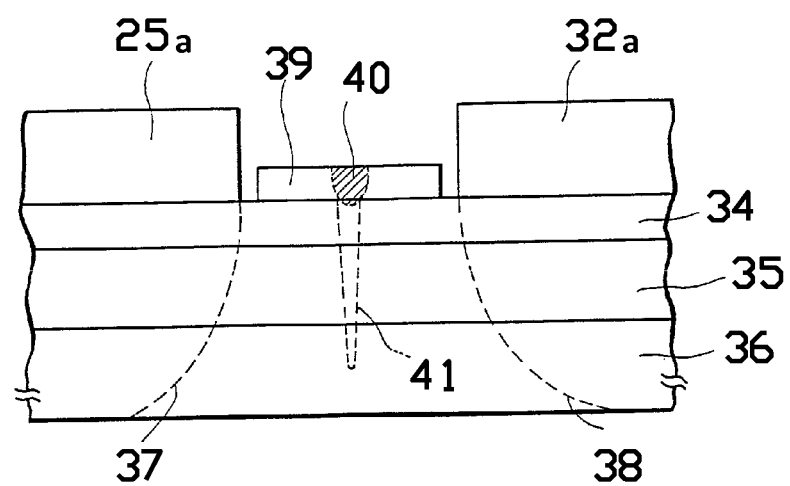
FIG. 6 is a cross section of the quantum interference device in the prior art [2].
Figure 7:
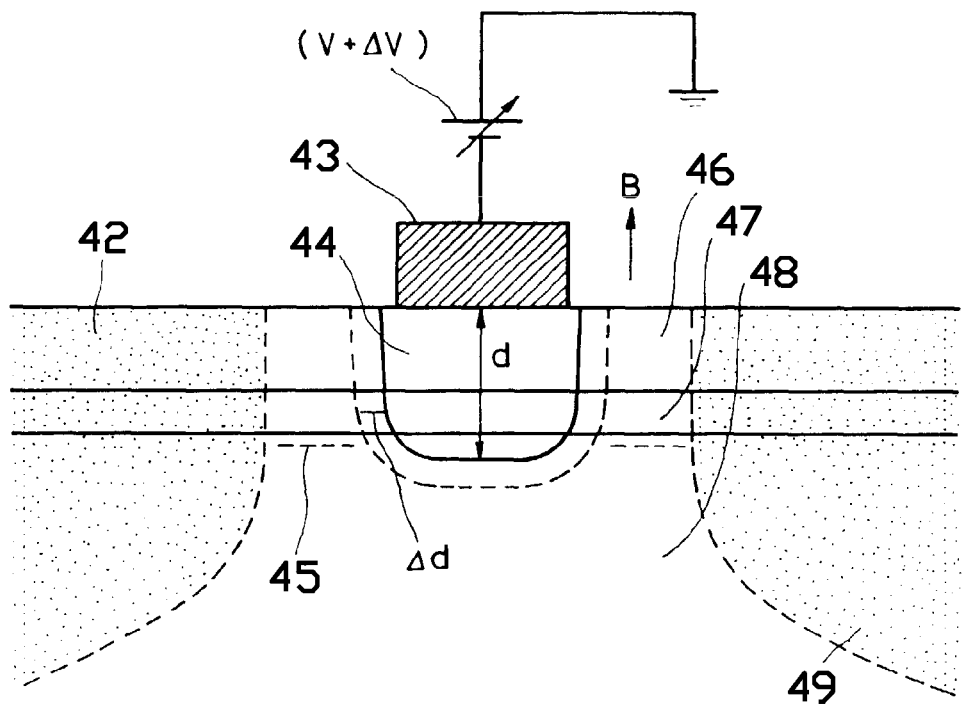
FIG. 7 is a quantum interference device in the prior art [3] operated using an electric field.
Figure 8:
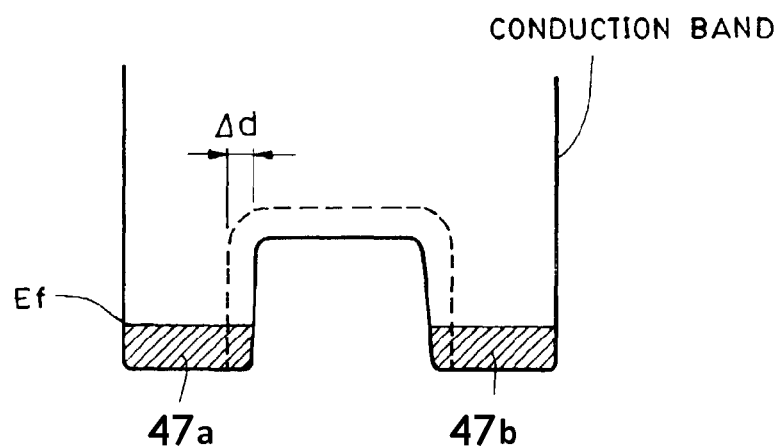
FIG. 8 is a schematic band diagram of the device of FIG. 7.
Figure 9:
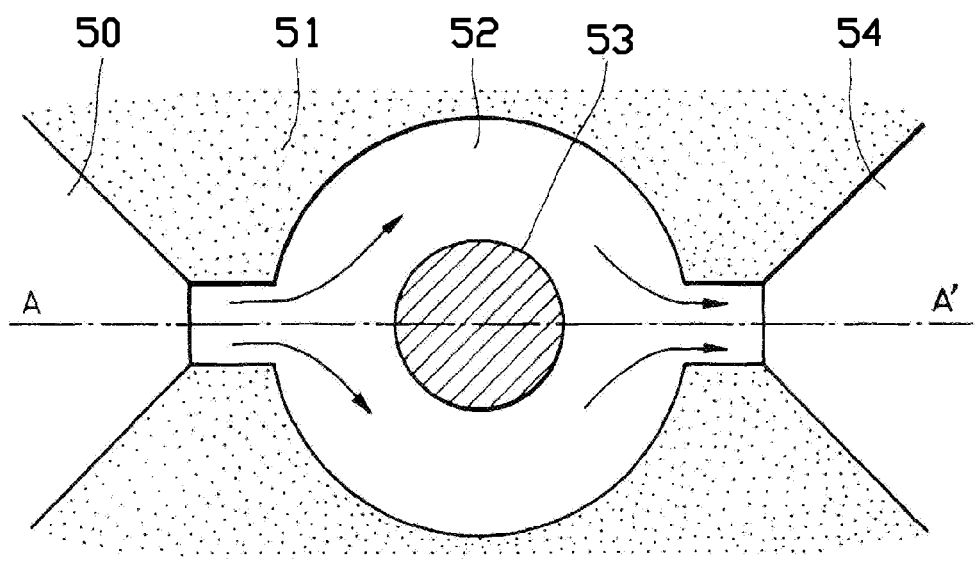
FIG. 9 is a quantum interference device operated as a photo detector in the prior art [3].
Figure 10:
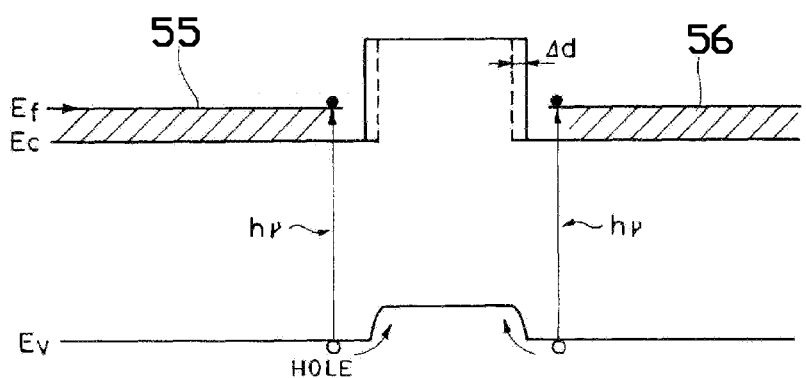
FIG. 10 is a schematic band diagram of the device of FIG. 9.
Figure 11:
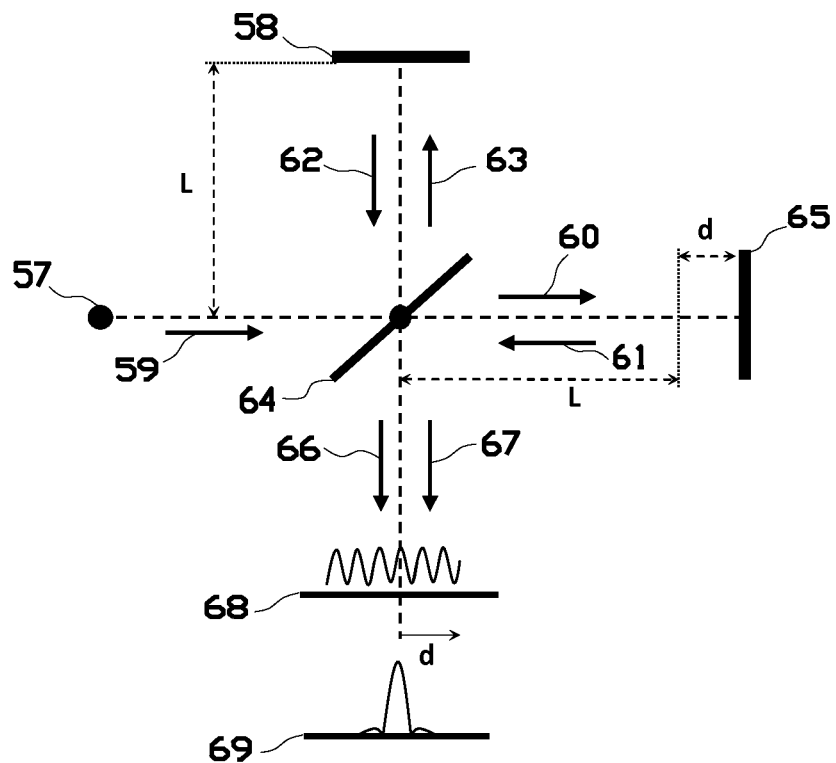
FIG. 11 is a schematic diagram of a light interferometer with either a monochromatic or a white light source.
Figure 12:
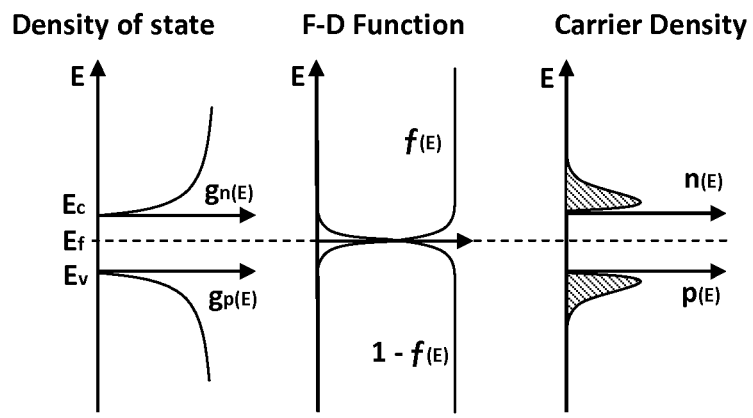
FIG. 12 is showing the theoretical carrier population density as a function of energy.

The device is symmetrical, having an equal length for each path segment along the axes AA' and BB', thus the phase difference between the paths of the traveling and reflected waves equals zero. The electrons injected from the source have an energy occupation according to the Fermi-Dirac distribution multiplied by the density of states function for the material comprising area 100 as seen in FIG. 12. Furthermore, all electrons injected at the source for each energy level of said distribution have a random initial phase. The electron could be described as a free wave in the direction of propagation along AA' and BB' thus the said electron energy distribution is continuous above the conduction band edge of materials 100 and 101. This situation is similar to the balanced white light interferometer case, where high transmission of energy is achieved through the device, resulting in large source to drain current.

A constructive interference of the said standing wave will occurs when L is an integer multiplication of the electron wavelength $\lambda$. Since the electron energy distribution above the conduction band edge is of continuous nature, there would be an energy level at which electrons having the said initial kinetic energy would have a high transport probability thorough the device regardless of their initial phase. The length L is designed in a manner to result in a constructive interference corresponding to either the average or the peak electron energy of the said distribution. Any change in the said path would result in a strong reduction of the transport probability and source to drain current, thus creating a measurable effect.

As mentioned above, for a given device dimension L there would be appropriate wavelengths for which the transport through the device is optimal. This in turn implies optimal electron kinetic energies matching these wavelengths. Since the electron energy occupation functions for the materials 100 and 101 are well known, the device size could be designed to yield an optimal transport for an electron kinetic energy of ½kT above the conduction band or for an energy matching the peak occupation as seen in FIG. 12. The occupation function has an exponential decay with increasing energy, thus any deviation from this optimal state, either by changing the path or its length, would result in a sharp decay in transport probability.

In order to get an interference of the said two electron waves, the dimension L must be kept below the scattering length of the electron in the device. This restriction must satisfy both the elastic and inelastic scattering lengths. The reason is that once inelastic scattering occurs, the phase information is lost and becomes random. Thus, a high mobility material such as GaAs or a highly ordered crystalline structure is a preferred medium for said device implementation. A feasible construction may be achieved by using state of the art Molecular Beam Epitaxy (MBE) or Metal Organic Chemical Vapor Deposition (MOCVD).

Yet another restriction arises from taking the electron coherence length into consideration. Since the structure size 2L must be kept at a physical size which is smaller than the coherence length, an estimation using the uncertainty principle with the de Broglie wavelength λ being the uncertainty in the particle location would yield:

$$\Delta k \cdot \Delta x \geq \tfrac{1}{2}; \lambda = h/p$$

The de Broglie wavelength of an electron having a kinetic energy of $E=\tfrac{1}{2}kT$ at room temperature is:

$$\lambda = h/(2mE)^{1/2} \approx 120 \text{ nm}$$

The coherence length I is given by:

$$I = v \cdot \Delta t = v/\Delta f = 2\pi/\Delta k \leq 4\pi \cdot \Delta x \leq 4\pi \cdot \lambda \approx 1.5 \text{ μm}$$

Where v is the electron velocity, k is the electron wave vector, λ the wavelength, p=m·v the momentum, m the electron effective mass, E the energy, k is Boltzmann's constant and h is plank's constant.

It should be emphasized that the above terminology using "transmitted", "advancing" and "reflected" referring to the electron wave does not imply a scattering process within the device which yields two independent interfering waves. The above given description is provided according to the classical theory point of view for the purpose of clarity and simplicity. The quantum mechanical point of view would see the electron as if "solving" the Schrodinger equation, and based on the expectation values for the corresponding classical properties, "deciding" whether or not to pass through the device according to the resulting transport probability. As mentioned before, the quantum mechanical interpretation for the wave particle duality does not conflict the classical result even when a single particle source is being used.

(a) First Embodiment of a Switch Operation

In a first embodiment of the present invention, as can be seen in FIG. 13, a control gate terminal 120a is added over an insulating layer 121a, to induce a field effect in the said device comprising area 100a, which results in a depletion region 122a of width d. The electron wave cannot propagate into said depletion region, since the density of states function of the material comprising area 100 is shifted to exclude the incident electron energy level from the allowable states in the region. The said depletion region, having a width proportional to the gate bias voltage, is formed in vicinity to the gate and modifies the length of the path section originally intersecting that region, thus modifying the acquired phase contributed by this path section by $2\pi \cdot d/\lambda$, for both the advancing wave 114a and reflected wave 113a resulting in a change in the transport probability through the device.

By optimizing the said gate bias the transport probability could be maximized to compensate for any non symmetrical device structure mismatches where the lateral path section does not match the vertical section as seen in FIG. 13. Any deviation from the said optimized bias would result in a corresponding change Δd to the said depletion width and a phase change of $2\pi \cdot \Delta d/\lambda$ to both waves 113a and 114a. A destructive interference would occur when $2\Delta d = \tfrac{1}{2}\lambda$. In this manner a high speed switching functionality may be obtained, since even a small change in the said path length results in a large change in the acquired phase which in turn changes the transport probability.

According to quantum mechanical theory, a free particle described by a wave function Ψ passing over a step like potential barrier results in a reflected $\Psi_r$ and transmitted $\Psi_t$ waves which could be described as:

$$\Psi_r = \Psi \cdot \exp(i\phi_r) \text{ and } \Psi_t = \Psi \cdot \exp(i\phi_t)$$

Where $\phi_r$ and $\phi_t$ are constant phase shifts due to energy conservation considerations ($\phi_r$ is usually taken as zero). The operation principal described herein is not compromised by these shifts since they are constant in nature regardless of the initial electron phase as it enters the device. Once the device is tuned to its optimal state, any constant phase shifts are accounted for as well. One of the innovation aspects disclosed in the present invention is that all types of mismatches and asymmetric properties could be compensated for by an optimal corresponding gate bias voltage.

The said change in transport probability results in a decrease in the source to drain current which is a measurable effect. Since the available electron energy states above the conduction band decrease exponentially with energy, as seen in FIG. 12 (according to the Fermi-Dirac distribution), any change from the above mentioned optimal state would result in a sharp drop in the said current thus yielding a switching device with high sensitivity to the gate voltage.

An additional degree of freedom to control and optimize the said transport probability could be achieved by using an external field, marked 140 in FIG. 13, being either electric or magnetic, may be used to interact with the electrons along segments of the propagation path, thus affecting the phase acquired along the path and formation of a constructive or destructive interference. This interaction could be carried through the AB effect or the electromagnetic force to help tune the said path to its optimal state.

(b) Second Embodiment of a Detector Operation

In a second embodiment of the present invention, the said device is used to measure the characteristics of an external ensemble, consisting of at least one particle, by having an interaction between the electron and said ensemble where said interaction affects one or more components of the electron wave function in the path section in vicinity to the ensemble thus generating a measurable effect.

Figure 14:
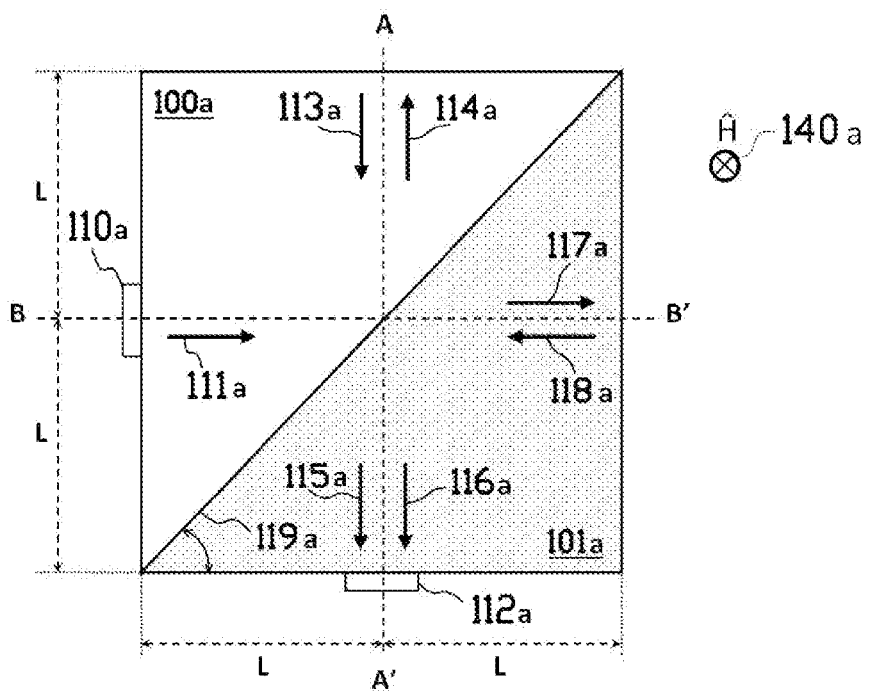
FIG. 14 is a quantum interference device in a second embodiment of the present invention.

Referring to FIG. 14, the device structure of the second embodiment is shown. The device forming area 100a and 101a are designed to yield interference of transmitted and reflected electron waves in the same manner as explained above, having a 45° angle at the interface 119a. The lateral and vertical path sections parallel to the symmetry axes BB' and AA' respectively are designed to be symmetrical having a length L each thus resulting in an overall zero phase difference between the said sections.

The said external ensemble could be a photon (FIG. 15) or forming either an electric (FIG. 16) or a magnetic (FIG. 17) dipole to interact with the electron, while said interaction could be based on the AB effect, carried through the electromagnetic force or by direct absorption of said photon.

An additional degree of freedom to control and optimize the said transport probability could be achieved by using an external field marked 140a in FIG. 14, being either electric or magnetic, may be used to interact with the electrons along segments of the propagation path, thus affecting the phase acquired along the path and formation of a constructive or destructive interference. This interaction could be carried through the AB effect or the electromagnetic force to help tune the said path to its optimal state.

When the said interaction is carried through the AB effect, either the electrostatic AB or magnetic AB, the electron wave phase component is modified as a result, and the transport probability through the device is changed. When the interaction is carried through the electromagnetic force or by photon absorption, the propagation path is modified to deviate from the symmetry axes AA' and BB' thus shifting the electron transport probability from the said optimal state. The structure implementation of the QID in the present invention has no restriction over the nature of the interaction, thus an interaction with a magnetic or electric dipole produces the said measurable effect which is apparent in the source to drain current.

Figure 15:
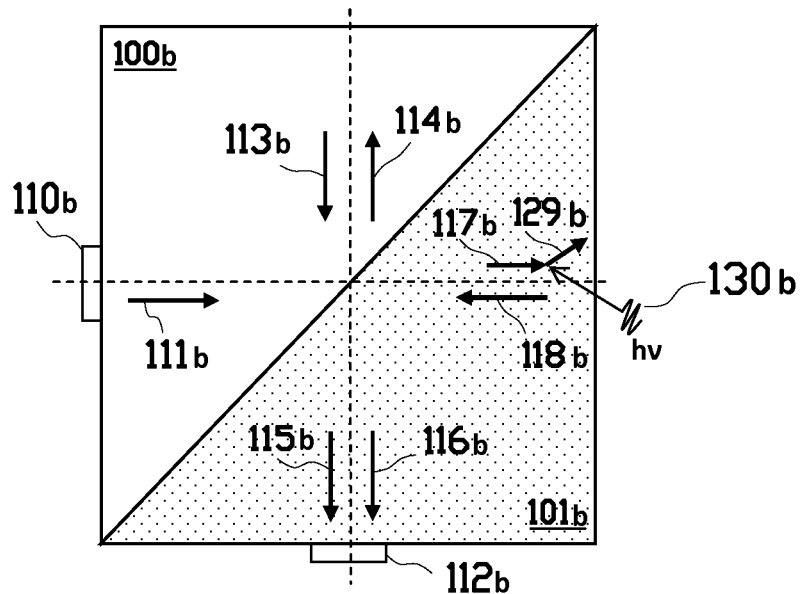
FIG. 15 is a quantum interference device in a second embodiment of the present invention operated as a photo detector.

FIG. 15 is a quantum interference device in a second embodiment of the present invention operated as a photo detector. An external photon marked 130b is absorbed by the electron as it passes through the device along the path section 117b. According to momentum and energy conservation law, the electron is deflected, as marked 129b, thus being unable to travel along its original optimal path from source to drain. Since only the optimal path provides a maximal source to drain current, a temporal drop in the current will occur, thus creating a measurable effect.

Figure 16:
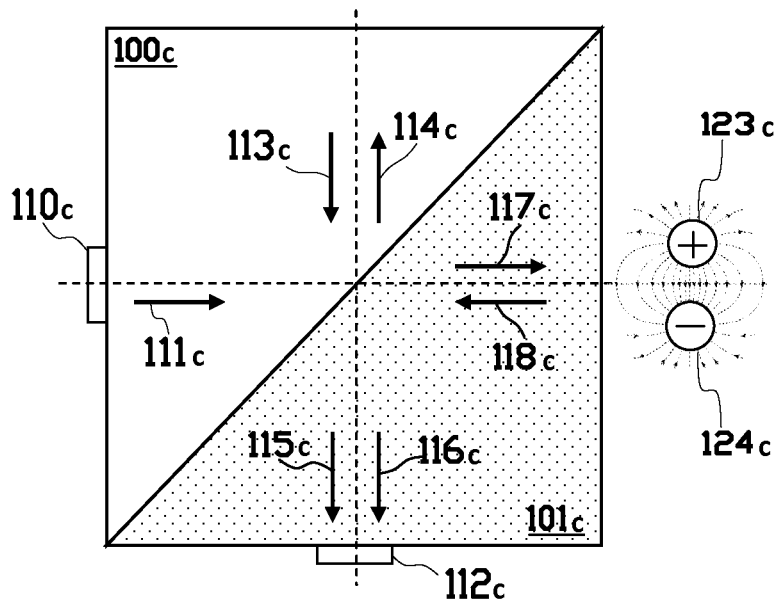
FIG. 16 is a quantum interference device in a second embodiment of the present invention having an interaction with an electric dipole.

FIG. 16 is a quantum interference device in a second embodiment of the present invention having an interaction with an electric dipole. An external ensemble comprised of a positively charged particle 123c and a negatively charged particle 124c produces an electric field in space. This electric field, in turn, induces a potential in vicinity to the electron path sections 117c and 118c and interacts with the electron either through the AB effect thus altering the phase component of its wave function, or through the Lorentz interaction to deflect its path. This change affects the transport probability as mentioned before, and the source to drain current will show a drop as long as the interaction is maintained, thus creating a measurable effect.

Figure 17:
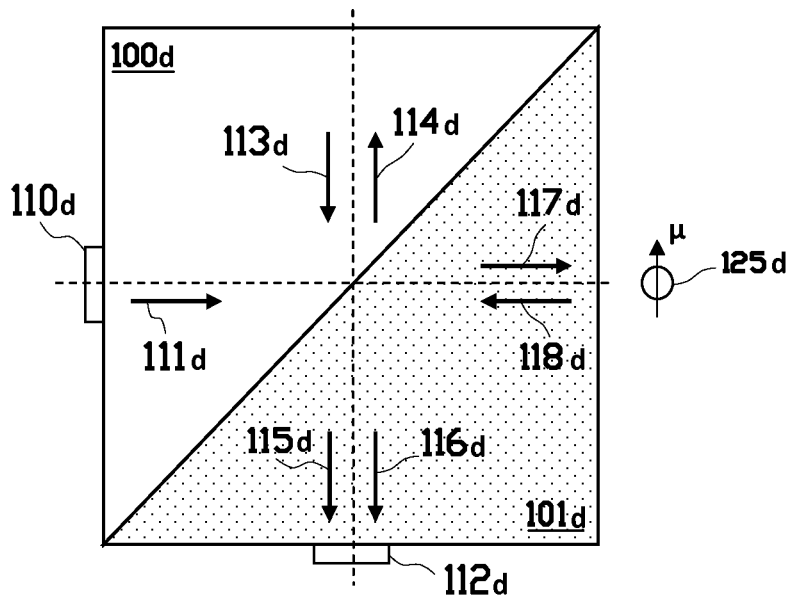
FIG. 17 is a quantum interference device in a second embodiment of the present invention having an interaction with a magnetic dipole.

FIG. 17 is a quantum interference device in a second embodiment of the present invention having an interaction with a magnetic dipole. An external ensemble comprised of a particle 125d having a magnetic moment μ induces a magnetic field in space. This field, located in vicinity to the electron path sections 117d and 118d, interacts with the electron either through the AB effect thus altering the phase component of its wave function, or through the Lorentz interaction to alter its path. This change affects the transport probability as mentioned before, and the source to drain current will show a drop as long as the interaction is maintained, thus creating a measurable effect.

Figure 18:
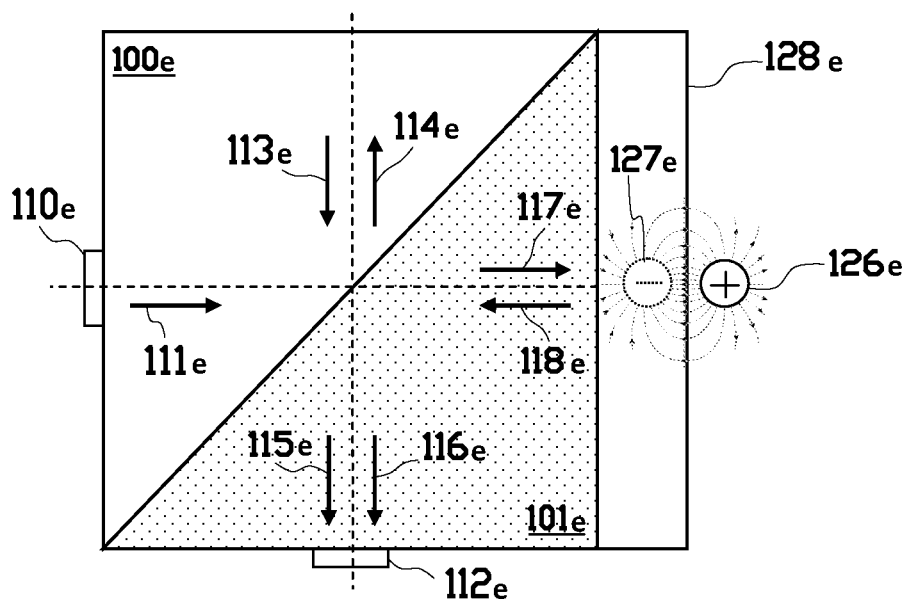
FIG. 18 is a quantum interference device in a second embodiment of the present invention having an interaction with an image charge.

FIG. 18 is a quantum interference device in a second embodiment of the present invention having an interaction with an image charge. A metal layer 128e is added to the external surface of the device, being isolated from any external potential source. An external ensemble comprised of a particle 126e having an electric charge produces an electric field in space. This field creates an image charge 127e in the metal layer which in turn induces a potential in vicinity to the electron path sections 117e and 118e that interacts with the electron through the AB effect thus altering the phase component of its wave function.

Figure 19:
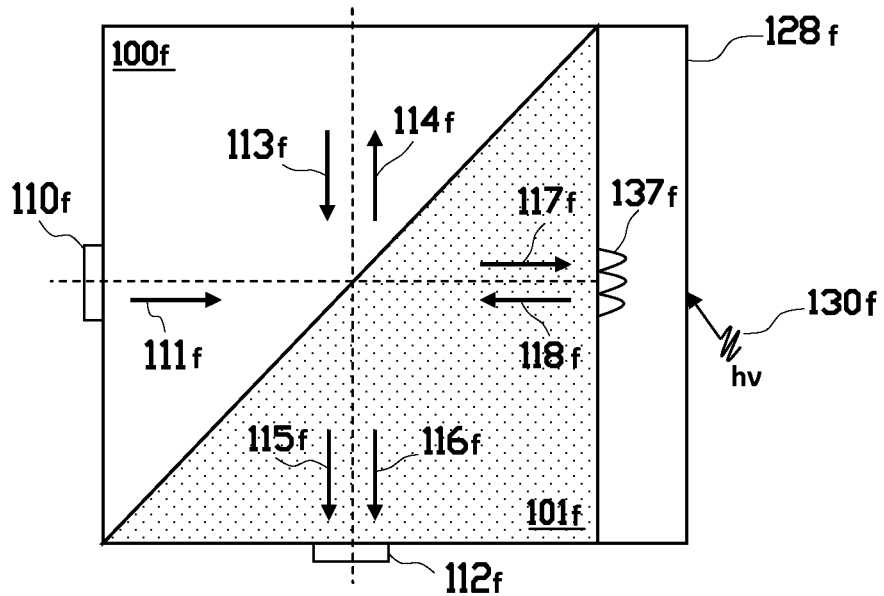
FIG. 19 is a quantum interference device in a second embodiment of the present invention having an interaction with a surface Plasmon.

FIG. 19 is a quantum interference device in a second embodiment of the present invention having an interaction with a surface Plasmon. A metal layer 128f is added to the external surface of the device being isolated from any external potential source. An external photon marked 130f interacts with the metal to invoke a surface Plasmon 137f. This surface Plasmon creates a spatial distribution of charge along the metal surface in vicinity to the electron path sections 117f and 118f and interacts with the electron through the AB effect thus altering the phase component of its wave function, or through the Lorentz interaction to deflect its path.

One of the novelty aspects of the present invention is that the said interaction can occur directly between the said external ensemble and the electron, (based on a direct electromagnetic force or by exchange of a photon) or indirectly, by adding a metal layer to at least one external surface of the device, through an image charge or a surface Plasmon wave. In the case where the ensemble comprises an electric or magnetic dipole moment, the interaction is carried through either the Lorentz force acting on the electron to alter its path, or thought the AB effect to alter its phase, where in either case, the said transport probability would deviate from the optimal state to create a measurable effect. The end result would be the same for all cases, in which sensor functionality is achieved.

In conclusion the said change in transport probability results in a decrease in the source to drain current which forms a measurable effect. Since the available electron energy states above the conduction band decrease exponentially with energy, any change from the above mentioned initially set optimal state, caused by an interaction with an external particle ensemble, would result in a decrease in the said source to drain current. In this manner, the present invention discloses a device having high sensitivity to an external interaction.

(c) Device Implementation

One method for an implementation of said device is demonstrated herein by using Silicon as the medium material where said two device comprising areas (marked 100 and 101 in FIG. 13) having different doping concentrations while being both n-type in this case. The De Broglie wavelength for Silicon at room temperature is roughly 270 nm, thus the coherence length is about 3.5 um. The size marked as L could be kept under 1 um to account for both elastic and inelastic scattering within the device as well as for the coherence length.

The doping level is kept at the same order of magnitude for both areas since a small conduction band energy level difference at the said interface between the two areas forms a step like potential barrier and would result in both an advancing and reflected electron waves. The doping level is kept relatively low to maintain low impurity related scattering on one hand and keep the potential step size in the order of the average electron kinetic energy at the other hand.

An additional measure used to minimize the above mentioned scattering is low temperature operation of the device. Silicon based solid state devices have an optimal temperature where the electron mobility is maximized. The prevailing scattering processes are phonon related and ionized impurity related. Phonon related scattering is dominant in high temperatures while impurity related scattering is dominant in low temperatures, thus Silicon devices operated at temperatures below 100°K display superior mobility properties.

The directions for the electron wave propagation are chosen as the conduction band minima of the reciprocal lattice Brillouin zone, known as the X point. In this case the BB' axis of FIG. 13 may correspond to [100] crystal direction (referred to as the x axis) and the AA' axis to [010] (referred to as the y axis). Thus a traveling electron wave in the x direction may be reflected to the y direction without violating the energy conservation law.

The crystal may be grown using state of the art methods (MBE or MOCVD) over an insulating substrate to a high level of precision in both doping level control and crystalline ordered structure. The direction perpendicular to the drawing of FIG. 13 is chosen as [001] (referred to as the z axis) and is kept in the nanometer regime to confine the electron inside a quantum well, thus resulting is a free traveling wave in both the x and y directions while having discrete energy levels in the z direction (which may be assumed to be occupied in the ground state).

The doping concentrations $N_1$ and $N_2$ for both areas 100 and 101, need to differ only in a sufficient manner to yield the necessary conduction band step like energy difference. Low doping levels result in higher electron mobility and good conduction properties while keeping the scattering length below the said elastic and inelastic limits.

The depletion layer width associated with a surface band bending $\xi$ under the gate is according to:

$$X_d = (2\epsilon_s \cdot \xi / e \cdot N_1)^{1/2}$$

Where $\epsilon_s$ is the dielectric permittivity and e is the electron charge.

A modulation of the gate voltage by $\Delta V$ would yield roughly the same surface band bending and result in a change to the depletion layer width of $\Delta X_d$:

$$\Delta X_d = X_d (\Delta V / 2V)$$

The resulting phase shift for every path segment is:

$$\Delta \theta = 2\pi \cdot \Delta X_d / \lambda$$

As mentioned before, a destructive interference occurs when $$2 \cdot \Delta X_d = (n + \tfrac{1}{2}) \lambda$$

Where n is an integer.

The work function difference between the gate forming material and the device forming material of the first area is known to create a naturally occurring band bending at the interface between these areas having a width $X_{do}$. This built in potential yields a depletion area even when no gate potential voltage is applied. When designing the device, the vertical dimension could be design to account for this naturally occurring depletion by having a size of $L + X_{do}$.

Thus the gate bias voltage may be used to tune the device to an initial state which corresponds to a zero phase shift, by determination of the depletion width under the gate. Any deviation from this optimal state will result in a sharp drop in the transport probability, and current flow from source to drain. Such deviation may arise from changing the gate voltage, where the device is operated as a switch according to the first embodiment or from an external interaction, where the device is operated as a detector according to the second embodiment. Thus for a voltage change of about $\Delta V$ at the gate terminal, the surface band bending will change by roughly $\Delta V$. when the following condition is met:

$$2 \cdot \Delta X_d = \tfrac{1}{2} \lambda$$

The said transport probability will drop significantly.

As can be seen in FIG. 13, the gate source and drain terminal sizes are carefully designed to be small, not covering the entire device edge, and carefully placed over the symmetry axes AA' and BB'. This design enhances the sensitivity of the device to a change in the gate bias, in the first embodiment, or to an interaction with an external particle ensemble in the second embodiment. The reason is that when a deviation of the electron from the said optimal path occurs, a small sized terminal would reduce the probability for this unwanted mode to be collected and be accounted for in the source to drain current, thus improving the signal associated with the source to drain current.

(d) Additional Embodiments

The above description shown for an embodiment of the present invention is using n-type Silicon for explanatory purposes. It is clear that the above description is valid for any kind of device operated using the same concept of advancing and reflected waves manipulated to interfere with each other, regardless of the type of substrate material being used to implement the device. Based on the above, those skilled in the art would realize that the embodiments of the present invention described herein are illustrative only and are not in any way limiting. Other embodiments of this invention will be obvious in view of this description. Including, but not restricting, the use of p type Silicon, where the majority of charge carriers are holes, or GaAs and AlGaAs hetero-structures, having the same device functionality under the same principles of operations.

In addition, the above implementation utilizes a device comprising material where electrons are the majority carriers having a corresponding lifetime. A similar device, having the same operational principal, could be implemented where a p-type material is used as the area marked 100 in FIG. 13 and where electrons are used to transport charge as minority carriers. The main advantage is that the lifetime in this case is that of minority carriers, which can be kept relatively long with low doping concentrations for areas 100 and 101. By using an n type material to comprise the source terminal 110, a PN junction in formed between the source and area 100. A forward biasing scheme for this junction would result in injection of electrons from the source 110 into the p-type area 100 where they act as minority carriers to transport charge.

The functionality presented above describes a device designed to yield an optimal path of propagation which gives a high transport probability. In this manner, the source to drain current magnitude is maximal at steady state operation and exhibits a drop whenever this state is interrupted by the gate modulation or the said interaction. Another alternative way to get the same functionality disclosed in the first and second embodiments of the present invention would be to design the device to operate at a low level steady state source to drain current in a sub optimal state. In this case the gate modulation or external interactions are used to shift the propagation path to its optimal state and the said current would peak. The main advantage in this mode of operation is power saving, since the steady state current is kept low. It is clear to those skilled in the art that the spirit and scope of the present invention includes this alternative method and mode of operation as well.

Furthermore, the operation principal disclosed in the present invention could be realized by using a uniform substrate material rather than two areas with different doping levels. For example, using a single crystal substrate and carefully engineering a dislocation along a specific crystal plane effectively creates a localized discontinuity in the energy band structure while keeping the crystalline ordered structure in tact. Referring to the Silicon implementation example mentioned above, the said dislocation could be created along the [110] crystal plane as the electron travels along [100] and [010] directions within a uniform silicon crystalline substrate. The said dislocation does not form an absolute barrier, preventing any electron transmission, since electrons can tunnel through and be reflected in a similar manner to the explained above, which would yield the same wave interference behavior shown in FIG. 13.

Figure 20:
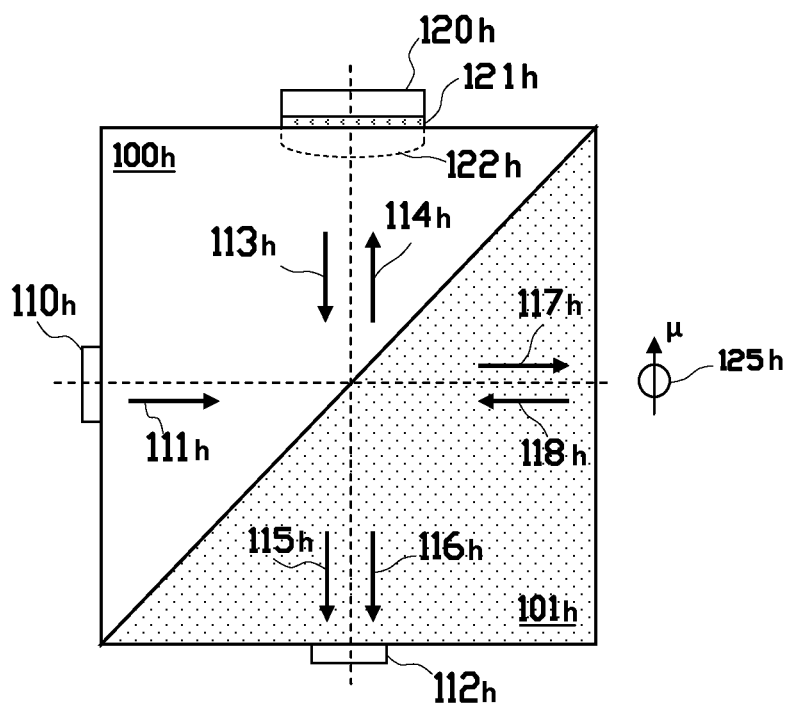
FIG. 20 is a quantum interference device in a first embodiment of the present invention additionally having an interaction with a magnetic dipole.

FIG. 20 is a quantum interference device in a first embodiment of the present invention additionally having an interaction with an external magnetic dipole 125h. A control gate terminal 120h is added over an insulating layer 121h, to induce a field effect in the said device comprising area 100h, which results in a depletion region 122h. This depletion region is used to optimize the transmission probability through the device in a similar manner to the implementation of the first embodiment. An optimal transmission would result in maximal source to drain current which is kept at a constant steady state level. Once an external magnetic dipole is present in close vicinity to the device, the external interaction, carried through the AB effect, would alter the phase component and affect the source to drain current as described above to yield the detector functionality of the second embodiment. Operating the gate along with the external interaction adds a degree of freedom to help tune the device and get a wider range of detection functionality.

Figure 21:
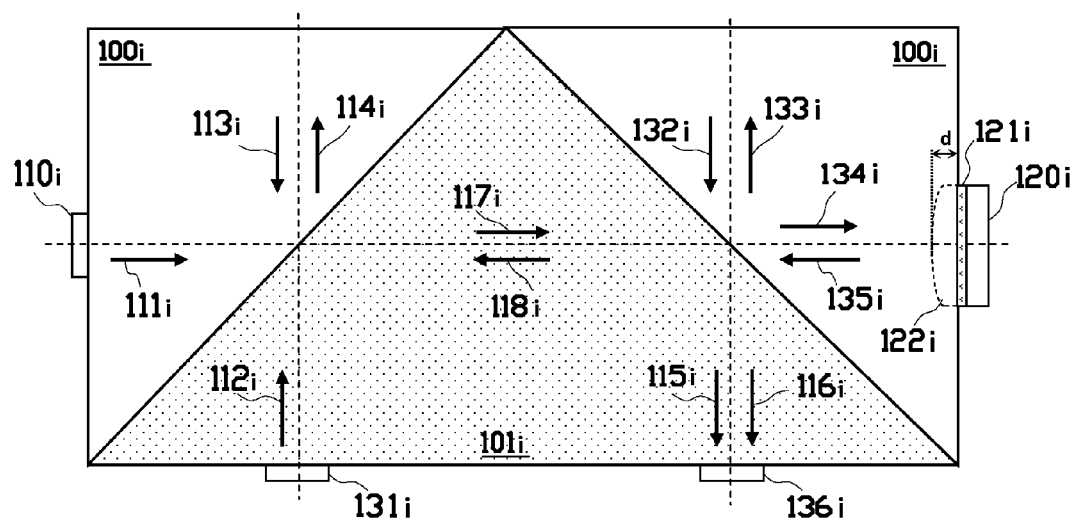
FIG. 21 is a quantum interference device of the present invention having a structure to perform a complex logic function.

FIG. 21 is a quantum interference device of the present invention having a structure to perform a complex logic function. It can be seen that the operational principal of the present invention is by no way limiting to a simple switching action but rather could be utilized to achieve larger cost effective designs by implementing higher logic functions using virtually an effective area equal to two devices of the first embodiment. Electrons are injected from two input terminals marked 110i and 131i and collected by a single output terminal marked 136i. The superposition of the two electron sources would yield a logic OR operation. A control gate 120i is used to control the transport probability in a similar manner to the first embodiment, thus allowing the transmission of the first input or the second input or both inputs, resulting in an overall multiplexer functionality.

Figure 22:
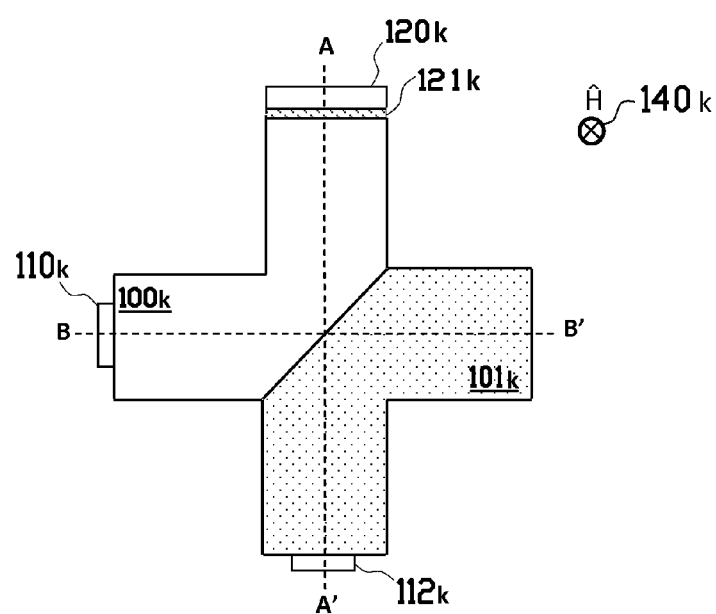
FIG. 22 is a quantum interference device in a first embodiment of the present invention having a tunneling immune structure.

FIG. 22 is a quantum interference device operated in a first embodiment of the present invention having a tunneling immune structure. Direct source to drain tunneling is a major issue for nanometer regime devices. Conventional MOSFET devices are limited by this phenomenon which dominates their functionality below the 50 nm channel length limit. The device of the present invention shown in FIG. 22 has higher source to drain tunneling immunity for two reasons. First, the source 110k and drain 112k are placed perpendicular to each other which results in a longer tunneling distance even if the device size is reduced to a nanometer scale. Second, as can be seen in FIG. 22, the substrate materials 100k and 101k could be shaped into a cross like form where the direct source to drain tunneling barrier is maximized and virtually equals to the work function of the substrate, making the direct tunneling process virtually impossible. The switching functionality may also be improved by this shape since unwanted modes of wave propagation and wave vectors may be eliminated in a similar manner to the operation principal of a wave guide.
(e)
The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable those skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A quantum interference device comprising:
   a free electron that could be described using quantum mechanical theory by a wave having wave vector and phase components;
   a propagation path of said electron composed of at least two intersecting sections containing a combination of propagating and reflected waves;
   a first material having a first energy distribution function for said electron, further including a first section of said path;
   a second material having a second energy distribution function for said electron, further including a second section of said path, and attached to said first material to form an interface;
   an intersection point on said interface where said first and second sections connect;
   a first normal vector to said interface originating from said intersection point further directed into said first material;
   a second normal vector to said interface originating from said intersection point further directed into said second material;
   a source terminal to inject said electron into said first section;
   a drain terminal to collect said electron from said second section;
   wherein a first angle, formed between said first section and said first normal vector, and a second angle, formed between said second section and said second normal vector, each equal to 45 degrees.
2. A quantum interference device according to claim 1, wherein said phase is affected by the Aharonov-Bohm effect.
3. A quantum interference device according to claim 1, further having a metal layer on the external surface of said first material, electrically isolated from said source terminal.

4. A quantum interference device according to claim 3, further having a metal layer on the external surface of said second material electrically isolated from said drain terminal.

5. A quantum interference device according to claim 1, wherein said wave vector is affected through photon absorption by said electron.

6. A quantum interference device according to claim 1, wherein said wave vector control is affected through electromagnetic interaction.

7. A quantum interference device according to claim 1, further having a metal layer on the external surface of said second material electrically isolated from said drain terminal.

8. A quantum interference device according to claim 1, wherein said wave vector is affected through plasmon interaction with said electron.

9. A quantum interference device comprising:
- a free electron that could be described using quantum mechanical theory by a wave having wave vector and phase components;
- a propagation path of said electron composed of at least two intersecting sections containing a combination of propagating and reflected waves;
- a first material having a first energy distribution function for said electron, further including a first section of said path;
- a second material having a second energy distribution function for said electron, further including a second section of said path and attached to said first material to form an interface;
- an intersection point on said interface where said first and second sections connect;
- a first normal vector to said interface originating from said intersection point further directed into said first material;
- a second normal vector to said interface originating from said intersection point further directed into said second material;
- a source terminal to inject said electron into said first section;
- a drain terminal to collect said electron from said second section;
- a gate terminal located next to a said section, biased to control the section's effective length by the field effect;
- wherein a first angle, formed between said first section and said first normal vector, and a second angle, formed between said second section and said second normal vector, each equal to 45 degrees.

10. A quantum interference device according to claim 9, further having a metal layer on the external surface of said first material, electrically isolated from said source and gate terminals.

11. A quantum interference device according to claim 10, further having a metal layer on the external surface of said second material electrically isolated from said drain and gate terminals.

12. A quantum interference device according to claim 9, wherein said wave vector is affected through photon absorption by said electron.

13. A quantum interference device according to claim 9, wherein said wave vector is affected through plasmon interaction with said electron.

14. A quantum interference device according to claim 9, further having a metal layer on the external surface of said second material electrically isolated from said drain and gate terminals.

15. A quantum interference device according to claim 9, wherein said phase is affected by the Aharonov-Bohm effect.

16. A quantum interference device according to claim 9, wherein said wave vector is affected through electromagnetic interaction.

17. A quantum interference device comprising:
- a free electron that could be described using quantum mechanical theory by a wave having wave vector and phase components;
- a propagation path of said electron within said device composed of at least two intersecting sections containing a combination of propagating and reflected waves;
- a first material having a first energy distribution function for said electron, further including a first section of said path;
- a second material having a second energy distribution function for said electron, further including a second section of said path and attached to said first material to form an interface;
- an intersection point on said interface where said first and second sections connect;
- a first normal vector to said interface originating from said intersection point further directed into the said first material;
- a second normal vector to said interface originating from said intersection point further directed into the said second material;
- wherein a first angle, formed between said first section and said first normal vector, and a second angle, formed between said second section and said second normal vector, each equal to 45 degrees.

18. A quantum interference device according to claim 17, further having a metal layer on the external surface of said first material.

19. A quantum interference device according to claim 17, further having a metal layer on the external surface of said second material.

* * * * *